United States Patent
Horikiri

(10) Patent No.: US 10,665,683 B2
(45) Date of Patent: May 26, 2020

(54) GAN MATERIAL AND METHOD OF MANUFACTURING SEMICONDUCTOR DEVICE

(71) Applicants: SCIOCS COMPANY LIMITED, Ibaraki (JP); SUMITOMO CHEMICAL COMPANY, LIMITED, Tokyo (JP)

(72) Inventor: Fumimasa Horikiri, Ibaraki (JP)

(73) Assignees: SCIOCS COMPANY LIMITED, Ibaraki (JP); SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/284,323

(22) Filed: Feb. 25, 2019

(65) Prior Publication Data

US 2019/0273137 A1  Sep. 5, 2019

(30) Foreign Application Priority Data

Mar. 2, 2018 (JP) .................................. 2018-37473

(51) Int. Cl.
*H01L 29/20* (2006.01)
*H01L 29/36* (2006.01)
(Continued)

(52) U.S. Cl.
CPC .... *H01L 29/2003* (2013.01); *H01L 21/02389* (2013.01); *H01L 21/02636* (2013.01);
(Continued)

(58) Field of Classification Search
CPC . H01L 29/2003; H01L 29/36; H01L 29/4236; H01L 29/8613; H01L 29/872; H01L 29/0619; H01L 29/66522; H01L 29/78; H01L 21/02389; H01L 21/2003; H01L 21/02664; H01L 21/2018; H01L 21/02636; H01L 21/0254; H01L 21/0262; H01L 21/02642; H01L 21/02579; H01L 21/02458; H01L 21/30635; H01L 33/00
USPC ................. 257/76, 615, 618, 761, 99, 15, 9, 257/E21.054, E21.065, E21.09, E21.218, 257/E21.228, E21.234, E21.461, E21.599,
(Continued)

(56) References Cited

U.S. PATENT DOCUMENTS 6,034,001 A * 3/2000 Shor ................... H01L 21/0445
257/769
2005/0137531 A1 * 6/2005 Prausnitz ........... A61B 5/14514
604/173
(Continued)

OTHER PUBLICATIONS

Murata, Junji, et al., "Photo-electrochemical etching of free-standing GaN wafer surfaces grown by hydride vapor phase epitaxy", Electrochimica Acta, 2015, pp. 89-95.
(Continued)

*Primary Examiner* — Dao H Nguyen
(74) *Attorney, Agent, or Firm* — Pearne & Gordon LLP

(57) ABSTRACT

There is provided a new technology for anodic oxidation etching performed to GaN material having arithmetic mean line roughness Ra of 15 nm or less at a measurement length of 100 μm on a bottom surface of a recess when anodic oxidation etching is performed at an etching voltage of 1 V while irradiating the GaN material with UV light to form the recess of 2 μm in depth.

13 Claims, 13 Drawing Sheets

(51) Int. Cl.
*H01L 21/02* (2006.01)
*H01L 21/20* (2006.01)

(52) U.S. Cl.
CPC .... *H01L 21/02664* (2013.01); *H01L 21/2003* (2013.01); *H01L 21/2018* (2013.01); *H01L 29/36* (2013.01)

(58) Field of Classification Search
USPC .... 257/E29.001, E29.005, E29.024, E29.89; 438/26, 478, 483, 695
See application file for complete search history.

(56) References Cited

U.S. PATENT DOCUMENTS

| 2009/0079035 | A1* | 3/2009 | Wang | B82Y 30/00 257/615 |
| 2010/0119782 | A1* | 5/2010 | Ohgane | B29D 11/00326 428/174 |
| 2010/0193768 | A1* | 8/2010 | Habib | H01L 31/03529 257/9 |
| 2010/0276665 | A1* | 11/2010 | Wang | H01L 21/0237 257/15 |
| 2014/0241493 | A1* | 8/2014 | Yokoyama | G01N 23/20008 378/36 |
| 2016/0203977 | A1* | 7/2016 | Schulze | H01L 21/74 257/618 |

OTHER PUBLICATIONS

Samukawa, Seiji, "Ultimate Top-down Etching Processes for Future Nanoscale Devices: Advanced Neutral-Beam Etching", Japanese Journal of Applied Physics, 2006, pp. 2395-2407, vol. 45, No. 4A.
Faraz, T., et al. "Atomic Layer Etching: What Can We Learn from Atomic Layer Deposition?", ECS Journal of Solid State Science and Technology, 4 (6) N5023-N5032), 2015, Department of Applied Physics, Eindhoven University of Technology, 5600 MB Eindhoven, The Netherlands.

* cited by examiner $V_{etch}$=3V, 4μm-etch $V_{etch}$=2V, 4μm-etch $V_{etch}$=1V, 4μm-etch $V_{etch}$=3V, 2μm-etch $V_{etch}$=2V, 2μm-etch $V_{etch}$=1V, 2μm-etch $V_{etch}$=0V, 2μm-etch

GAN MATERIAL AND METHOD OF MANUFACTURING SEMICONDUCTOR DEVICE

TECHNICAL FIELD

The present invention relates to a GaN material and a method of manufacturing a semiconductor device.

DESCRIPTION OF RELATED ART

Gallium nitride (GaN) is used as a material for producing semiconductor devices such as light-emitting elements and transistors. Etching is used as a processing technique for manufacturing a semiconductor device using GaN. For example, when manufacturing a MISFET (metal-insulator-semiconductor field-effect transistor) having a trench gate structure, an inner surface of a recess formed by etching becomes MIS interface that is an operation part, and therefore it is desirable that a highly flat surface with less damage is formed by etching.

Etching that involves anodic oxidation (also referred to as "anodic oxidation etching" below) is being focused as a technique to etch GaN materials (see, for example, non-Patent Document 1). The anodic oxidation etching is preferable because it is a type of wet etching that causes less damage compared to ordinary dry etching and also because the device used in the etching is more simple compared to special dry etching techniques that are designed to cause less damage, such as neutral-beam etching (see, for example, non-Patent Document 2) and atomic layer etching (see, for example, non-Patent Document 3).

Non-patent document 1: J. Murata et al., "Photo-electrochemical etching of free-standing GaN wafer surfaces grown by hydride vapor phase epitaxy", Electrochimica Acta 171 (2015) 89-95

Non-Patent Document 2: S. Samukawa, JJAP, 45 (2006) 2395.

Non-Patent Document 3: T. Faraz, ECS J. Solid Stat. Scie. & Technol., 4, N5023 (2015).

An object of the present invention is to provide a novel technology to perform anodic oxidation etching to GaN material, for example to provide a GaN material suitable for processing by anodic oxidation, and for example to provide a technology to perform anodic oxidation etching to GaN material with improved flatness.

SUMMARY OF THE INVENTION

An aspect of the present invention provides a GaN material having arithmetic mean line roughness Ra of 15 nm or less at a measurement length of 100 µm on a bottom surface of a recess when anodic oxidation etching is performed at an etching voltage of 1 V while irradiating the GaN material with UV light to form the recess of 2 µm in depth.

Another aspect of the present invention provides a method of manufacturing a semiconductor device, including a step of performing anodic oxidation etching to a region where a GaN material dislocation density is less than $1 \times 10^7/cm^2$ by applying an etching voltage thereto while irradiating this region with UV light, to form a recess, wherein the etching voltage is a voltage in a range of 0.16 V or more and 1.30 V or less.

Another aspect of the present invention provides a method of manufacturing a semiconductor device, including:

preparing a GaN material having a GaN substrate and a GaN layer epitaxially grown on the GaN substrate, the epitaxially grown GaN layer further including a GaN layer doped with p-type impurities and not annealed to activate the p-type impurities; and performing anodic oxidation etching to the GaN layer while irradiating the GaN material with UV light, thereby performing etching to the GaN layer doped with p-type impurities and not annealed to activate the p-type impurities, to form a recess.

Advantage of the Invention

There is provided a GaN material suitable for processing by anodic oxidation.

Further, there is provided a technology to perform anodic oxidation etching to GaN material, with improved flatness.

DETAILED DESCRIPTION OF THE INVENTION

A gallium nitride (GaN) material 100 according to an embodiment of the present invention will be described. Also will be described etching that involves anodic oxidation (also referred to as "anodic oxidation etching" below) and that is to be performed on the GaN material 100. The anodic oxidation etching can be used as a method for processing the GaN material 100 and also as a method for evaluating a characteristic of the GaN material 100.

First Embodiment

Figure 1A:
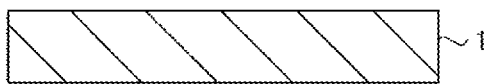
FIGS. 1A through 1G are respectively schematic sectional diagrams illustrating a method for producing a GaN material (substrate) according to a first embodiment of the present invention.

A first embodiment will be described first. The first embodiment illustrates a GaN substrate 10 (also referred to as "substrate 10" below) as an example of the GaN material 100. FIGS. 1A through 1G are schematic sectional diagrams illustrating the process of producing the substrate 10 using a void-assisted separation (VAS) method. First, an underlying substrate 1 is prepared, as illustrated in FIG. 1A. A sapphire substrate is illustrated as an example of the underlying substrate 1. A silicon (Si) substrate, a gallium arsenide (GaAs) substrate, or the like may be used as the underlying substrate 1.

Figure 1B:

Next, an underlying layer 2 is formed on the underlying substrate 1, as illustrated in FIG. 1B. The underlying layer 2 may be constituted by, for example, a stack including a buffer layer constituted by low temperature-grown GaN and a single crystal layer of GaN. The buffer layer and the single crystal layer may be formed by, for example, metalorganic vapor phase epitaxy (MOVPE). Trimethyl gallium (TMG) may be used as an example of gallium (Ga) raw material and ammonia ($NH_3$) may be used as an example of nitrogen (N) raw material. The thicknesses of the buffer layer and the single crystal layer may respectively be, for example, 20 nm and 0.5 μm.

Figure 1C:
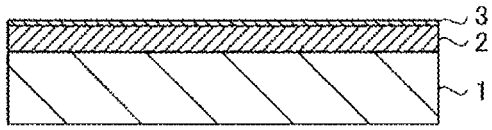

Next, a metal layer 3 is formed on the underlying layer 2, as illustrated in FIG. 1C. The metal layer 3 may be formed by, for example, vapor deposition of titanium (Ti) in an amount of a thickness of 20 nm.

Figure 1D:
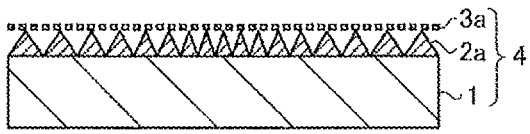

Next, heat treatment is carried out to nitride the metal layer 3 so as to form a nanomask 3a and to form voids in the underlying layer 2 so as to form a void-including layer 2a, as illustrated in FIG. 1D. The heat treatment may be carried out in the following way, for example. The underlying substrate 1 on which the underlying layer 2 and the metal layer 3 have been formed is put in an electric furnace and placed on a susceptor having a heater. The underlying substrate 1 is then heated in an atmosphere containing hydrogen gas ($H_2$ gas) or hydride gas. Specifically, heat treatment may be carried out, for example, for 20 minutes in an $H_2$ gas flow containing 20% of $NH_3$ gas as nitrified gas and at a prescribed temperature, for example, a temperature between 850° C. and 1,100° C. (inclusive).

Nitridation of the metal layer 3 due to such heat treatment results in the formation of a nanomask 3a, the surface of which has highly densely formed fine pores. Part of the underlying layer 2 is etched through the fine pores of the nanomask 3a, resulting in the formation of voids in the underlying layer 2 and thus in the formation of the void-including layer 2a. In this way, a substrate 4 in which voids are formed ("void-formed substrate 4" below) is produced that includes the void-including layer 2a and the nanomask 3a formed on the underlying substrate 1.

Preferably, the heat treatment is carried out in the following way. The heat treatment is carried out such that the "void formation rate (volume porosity)" indicative of the proportion in volume of the voids in the void-including layer 2a is uniform on the underlying substrate 1 in the circumferential direction. Specifically, the susceptor on which the underlying substrate 1 is placed may be rotated, for example, so as to carry out heat treatment uniformly in the circumferential direction. It is also possible to, for example, adjust the degree to which the heater heats the face of the underlying substrate 1, thereby making the temperature distribution in the epitaxial substrate uniform in the circumferential direction. Furthermore, the heat treatment is carried out such that the void formation rate in the void-including layer 2a increases steadily from the center of the underlying substrate 1 toward the outer circumference thereof in the radial direction. Specifically, the degree to which the heater heats the face of the underlying substrate 1 may be adjusted, for example, so that the temperature of the underlying substrate 1 increases monotonically from the center of the underlying substrate 1 toward the outer circumference thereof in the radial direction.

Figure 1E:
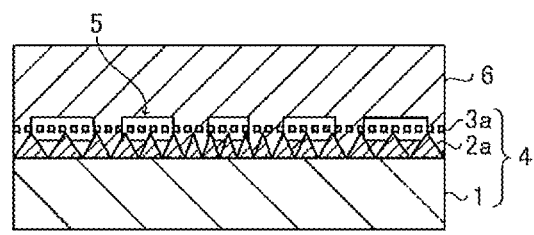
Figure 2:
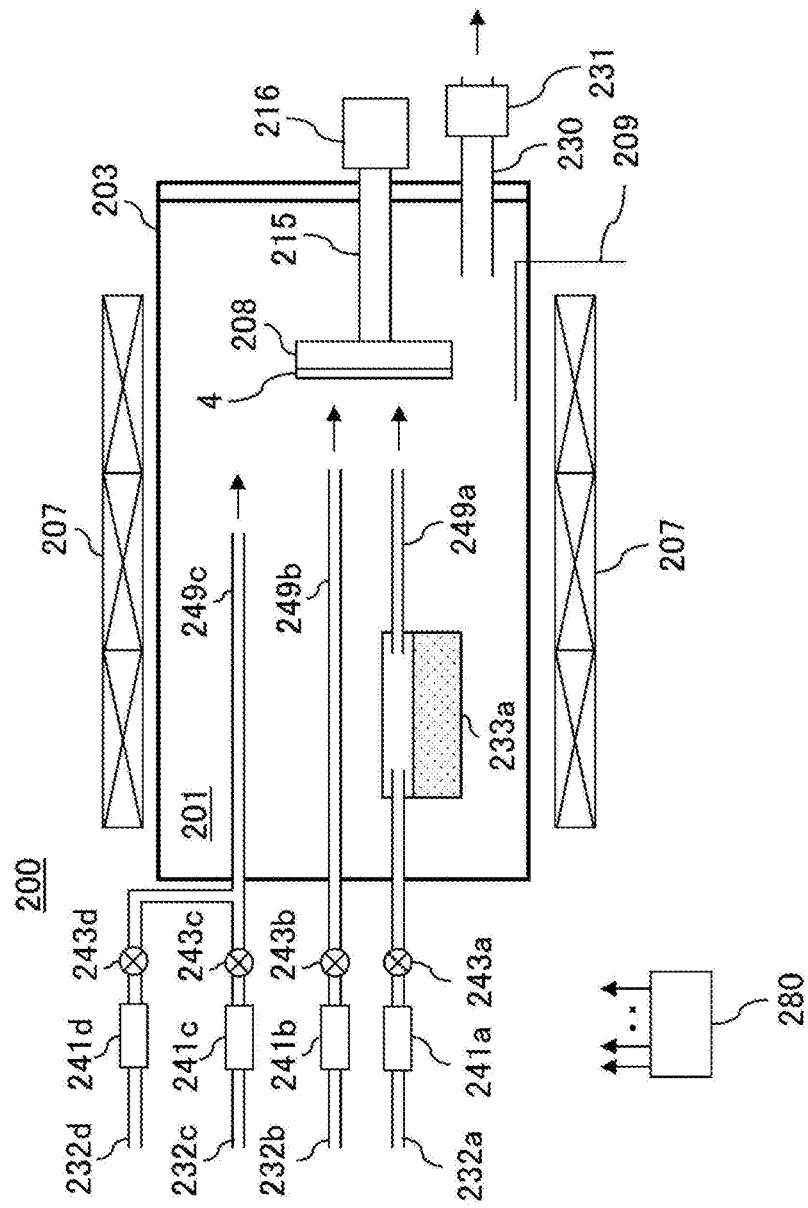
FIG. 2 is a schematic structural diagram illustrating an example of an HVPE device.

Next, a crystal 6 is grown on the nanomask 3a of the void-formed substrate 4, as illustrated in FIG. 1E. The crystal 6 is grown by a gas phase method, specifically by a hydride vapor phase epitaxy (HVPE) method. In this regard, an HVPE device 200 will be now described. FIG. 2 is a schematic structural diagram illustrating an example of the HVPE device 200.

The HYPE device 200 is formed from a heat-resistant material, such as quartz, and includes a hermetic container 203, the interior of which is provided with a film formation chamber 201. A susceptor 208 serving to hold the void-formed substrate 4 subject to treatment is provided inside the film formation chamber 201. The susceptor 208 is connected to a rotary shaft 215 of a rotary mechanism 216 and is configured to be rotatable. Gas supply tubes 232a through 232c serving to supply hydrochloric acid (HCl) gas, $NH_3$ gas, and nitrogen gas ($N_2$ gas) into the film formation chamber 201 are connected to one end of the hermetic container 203. A gas supply tube 232d serving to supply hydrogen ($H_2$) gas is connected to the gas supply tube 232c. Flow rate control devices 241a through 241d and valves 243a through 243d are provided respectively on the gas supply tubes 232a through 232d in that order from an upstream side. A gas generation device 233a that accommodates a Ga melt as raw material is provided downstream of the gas supply tube 232a. A nozzle 249a is connected to the gas generation device 233a. The nozzle 249a serves to supply gallium chloride (GaCl) gas produced by reaction between HCl gas and the Ga melt toward the void-formed substrate 4 held on the susceptor 208. Nozzles 249b and 249c are connected respectively to the downstream side of the gas supply tubes 232b and 232c. The nozzles 249b and 249c serve to supply the various gases supplied from the gas supply tubes 232b and 232c toward the void-formed substrate 4 held on the susceptor 208. A gas discharge tube 230 serving to discharge the gas inside the film formation chamber 201 is provided on the other end of the hermetic container 203. A pump 231 is provided on the gas discharge tube 230. Zone heaters 207 serving to heat the interior of the gas generation device 233a and the void-formed substrate 4 held on the susceptor 208 to desired temperatures are provided around the outer periphery of the hermetic container 203, and a temperature sensor 209 serving to measure the temperature inside the film formation chamber 201 is provided in the hermetic container 203. The members included in the HVPE device 200 are connected to a controller 280 constituted by a computer and are configured such that the processing procedures and processing conditions described later are controlled by a program that is executed on the controller 280.

The crystal 6 epitaxial processing may, for example, be implemented by the processing procedures below using the HVPE device 200. First, Ga is accommodated in the gas generation device 233a as raw material. The void-formed substrate 4 is placed and held on the susceptor 208. Then, a gas mixture containing $H_2$ gas and $N_2$ gas is supplied into the film formation chamber 201 while the film formation chamber 201 is being heated and gas is being discharged therefrom. In a state where the film formation temperature and the film formation pressure inside the film formation chamber 201 have reached the desired temperature and pressure and the atmosphere inside the film formation chamber 201 has become the desired atmosphere, gas supply from the gas supply tubes 232a and 232b is carried out such that GaCl gas and $NH_3$ gas are supplied to the void-formed substrate 4 as film formation gases.

The processing conditions for the crystal 6 epitaxial processing may be as follows, for example.

Growth temperature Tg: 980° C.-1,100° C., preferably 1,050° C.-1,100° C.

Pressure inside film formation chamber 201: 90-105 kPa, preferably 90-95 kPa GaCl gas partial pressure: 1.5-15 kPa $NH_3$ gas partial pressure/GaCl gas partial pressure: 4-20

$N_2$ gas flow rate/$H_2$ gas flow rate: 1-20

In the epitaxial processing, the GaN crystal that started to grow from the void-including layer 2a appear on the surface through the fine pores of the nanomask 3a, resulting in the formation of initial nuclei on the nanomask 3a. The growth of the initial nuclei in the thickness direction (vertical direction) as well as the in-plane direction (horizontal direction) and bonding of the same in the plane results in the formation of the crystal 6 constituted by a continuous film formed from a GaN single crystal. In areas where no initial nuclei are formed, voids 5 are formed between the nanomask 3a and the crystal 6 according to the presence of the voids in the void-including layer 2a. Since the void formation rate in the void-including layer 2a is controlled in the aforementioned way, the voids 5 are formed uniformly in the circumferential direction and become larger from the center toward the outside in the radial direction.

In this epitaxial processing, the crystal 6 is grown on the void-formed substrate 4, so the distribution of initial nucleus generation density can be made more uniform compared to the epitaxially lateral overgrowth (ELO) method employing a stripe mask or other such methods in which the distribution of initial nucleus generation density is made non-uniform to create dislocation concentration areas in which local dislocation density is extremely high (for example, $1\times10^7/cm^2$ or more). Accordingly, in-plane maximum dislocation density can be limited to a low value (for example, lower than $1\times10^7/cm^2$).

Moreover, in the epitaxial processing, GaN crystal growing from the void-including layer 2a appears on the surface through the fine pores of the nanomask 3a more readily toward the center in the radial direction where the void formation rate is lower, thus initial nuclei tend to form earlier toward the center. In other words, GaN crystal growing from the void-including layer 2a appears on the surface through the fine pores of the nanomask 3a less readily toward the outside in the radial direction where the void formation rate is higher, thus initial nuclei tend to form later toward the outside. Accordingly, the growth and boding of the initial nuclei can be made to progress gradually from the center toward the outside in the radial direction, so it is easier to grow the initial nuclei into a larger size. Furthermore, since such growth and bonding of the initial nuclei can be made to progress uniformly in the circumferential direction, crystal quality such as the in-plane uniformity of the crystal 6 can be enhanced.

Preferably, the crystal 6 grown has a thickness that enables at least one independent substrate 10 to be obtained from the crystal 6, for example, a thickness of 0.2 mm or more. There are no particular limitations on the upper limit of the thickness of the crystal 6 grown.

Figure 1F:
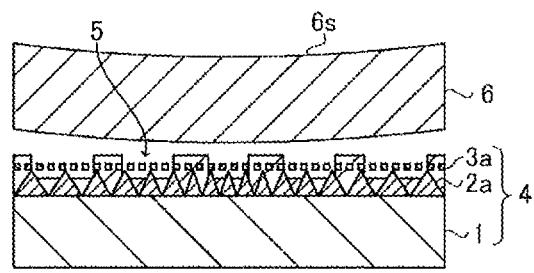

Next, the crystal 6 is peeled off from the void-formed substrate 4, as illustrated in FIG. 1F. This peeling is achieved during growth of the crystal 6 or in the process of cooling the interior of the film formation chamber 201 after completion of the growth of the crystal 6 as a result of the crystal 6 peeling off spontaneously from the void-formed substrate 4; here, the voids 5 formed between the crystal 6 and the nanomask 3a serve as the boundary of peeling.

Force, which is the result of mutual attraction of the initial nuclei bonding together during growth of the crystal 6, occurs in the crystal 6, so the crystal 6 contains tensile stress thereinside. Due to this tensile stress, the crystal 6 having peeled off warps in the manner of the growth-side surface thereof being depressed. Accordingly, the c face of the GaN single crystal constituting the crystal 6 that has peeled off curves in the form of a depressed spherical surface relative to an imaginary plane that is perpendicular to a direction normal to the center of a principal face 6s of the crystal 6. "Spherical surface" as referred to herein means a curved surface that approximates a spherical surface. "Approximates a spherical surface" as referred to herein means approximating the spherical surface of a true circle or an ellipse with an error falling within a prescribed error range.

Since the voids 5 are formed uniformly in the circumferential direction and so as to become larger from the center toward the outside in the radial direction, the crystal 6 can peel off uniformly from the outer circumference toward the center of the void-formed substrate 4 in the circumferential direction. Accordingly, natural peeling that is in conformity with the warping shape of the crystal 6 can be achieved, and therefore, the generation of unwanted stress that result from peeling can be limited. So, in this production method, as described above, crystal growth is carried out employing a VAS method while controlling the void formation rate in the aforementioned way; thus, a crystal 6 with enhanced crystal quality such as in-plane uniformity can be obtained.

After completion of the growth of the crystal 6 having a prescribed thickness, supply of the various gases used for the epitaxial processing is stopped and the atmosphere inside the film formation chamber 201 is substituted with $N_2$ gas to recover the atmospheric pressure. The void-formed substrate 4 and the crystal 6 are drawn out of the film formation chamber 201 after the temperature inside the film formation chamber 201 has been lowered to a temperature at which such draw-out work is possible.

Figure 1G:
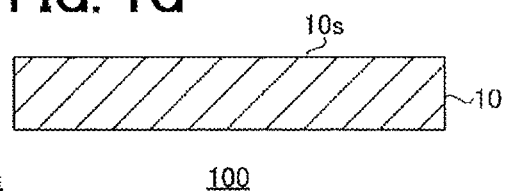

Next, the crystal 6 is machined (for example, cut with a wire saw) and rubbed, as appropriate, to obtain one or more substrates 10 from the crystal 6, as illustrated in FIG. 1G. The crystal face with a low index closest to the principal face 10s of the substrate 10 illustrated in FIG. 1G as an example is the c face.

The substrate 10 is produced in the aforementioned way. In addition to having a maximum dislocation density limited to be lower than $1\times10^7/cm^2$, the substrate 10 has high in-plane uniformity. The following describes an example of a specific condition that represents a "limited" dislocation density of the substrate 10. In the principal face 10s of the substrate 10, measurement is carried out using the cathodoluminescence (CL) method by scanning a 500 μm-diameter observation area within a 3 mm-square measurement area. The measurement is carried out on more or less ten such observation areas. At this time, the maximum dislocation density is lower than $1\times10^7/cm^2$, and in a preferred example, $5\times10^6/cm^2$ or lower. Preferably, an average dislocation density is $3\times10^6/cm^2$ or lower, for example. There are no particular limitations on a minimum dislocation density. The ratio of a maximum dislocation density to a minimum dislocation density may increase in conformity with a decrease in a minimum dislocation density, and as a rough standard, may be 100:1 or less, or 10:1 or less, for example.

The inventors of the present invention arrived at the finding that the substrate 10 constituting the GaN material 100 according to the first embodiment is a suitable material to be processed using anodic oxidation etching to form a recess with superior internal flatness (i.e. flatness of the internal faces of the recess). The Anodic oxidation etching and the internal flatness of the formed recess will be described in detail later. The principal face 10s may be used as an example of a face in which such a recess is formed using anodic oxidation etching (also referred to as an "etched face" below).

Impurities may be added to the substrate 10. If impurities are to be added, a gas supply tube and the like for supplying gas that contains such impurities may be additionally provided in the HYPE device 200 illustrated in FIG. 2. Examples of such impurities include those serving to impart electroconductivity to the substrate 10, and may be n-type impurities, for example. Usable examples of n-type impurities include silicon (Si) and germanium (Ge). If Si is to be added, for example, then dichlorosilane ($SiH_2Cl_2$) may be used as Si raw material, for example. Impurities may also be those serving to impart semi-insulating properties to the substrate 10, for example.

Second Embodiment

Figure 3:
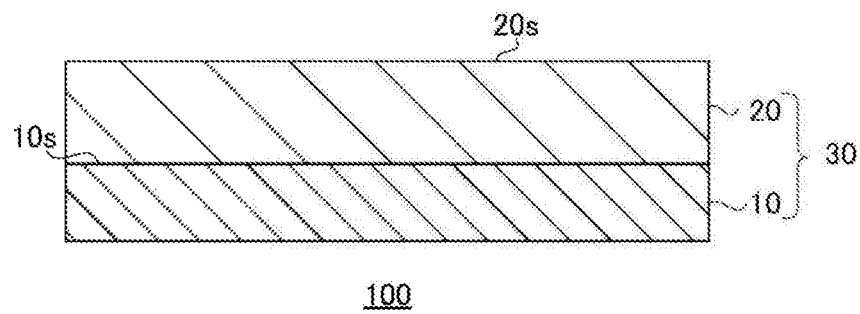
FIG. 3 is a schematic sectional diagram illustrating a GaN material (epitaxial substrate) according to a second embodiment.

Next, a second embodiment will be described. In the second embodiment, a first experimental example will also be described together. In the second embodiment, as illustrated in FIG. 3, a stack 30 (also referred to as an "epitaxial substrate 30" below), which includes a substrate 10 and a GaN layer 20 that is epitaxially grown (also referred to as an "epitaxial layer" below) on the substrate 10, is illustrated as an example of the GaN material 100. For the substrate 10, the substrate 10 described in the first embodiment may be used preferably.

The second embodiment features an example case where n-type impurities are added to both the substrate 10 and the epitaxial layer 20. Although there are no particular limitations on the constitution of the substrate 10 and the epitaxial layer 20, the following illustrates a possible example. In the substrate 10, Si may be added as an example of n-type impurities at a concentration of between $1\times10^{18}/cm^3$ and $1\times10^{19}/cm^3$ (inclusive). In the epitaxial layer 20, Si, for example, may be added at a concentration of between $3\times10^{15}/cm^3$ and $5\times10^{16}/cm^3$ (inclusive). When the epitaxial substrate 30 is to be used as a material for a semiconductor device, the substrate 10 would presumably be used as a contact layer for contact with an electrode and the epitaxial layer 20 would presumably be used as a drift layer, and it is preferred that the concentration of the n-type impurities added to the epitaxial layer 20 be lower than that of the substrate 10 from the view point of an increase in pressure-withstanding performance. Although not particularly limited, the thickness of the substrate 10 may be 400 µm, for example. The thickness of the epitaxial layer 20 may be between 10 µm and 30 µm (inclusive), for example. The epitaxial layer 20 may be constituted by a stack of multiple GaN layers having differing n-type impurity concentrations.

The epitaxial layer 20 may be grown on the principal face 10s of the substrate 10 by MOVPE, for example. TMG may be used as an example of Ga raw material, $NH_3$ may be used as an example of N raw material, and monosilane ($SiH_4$) may be used as an example of Si raw material. The epitaxial layer 20 grows incorporating the crystallinity of the substrate 10, so similarly to the substrate 10, has its maximum dislocation density limited to be lower than $1\times10^7/cm^2$ while also having high in-plane uniformity.

The inventors of the present invention arrived at the finding that the epitaxial substrate 30 constituting the GaN material 100 according to the second embodiment is a suitable material to be processed using anodic oxidation etching to form a recess with superior internal flatness, as will be described in detail in the experimental example below.

Figure 4:
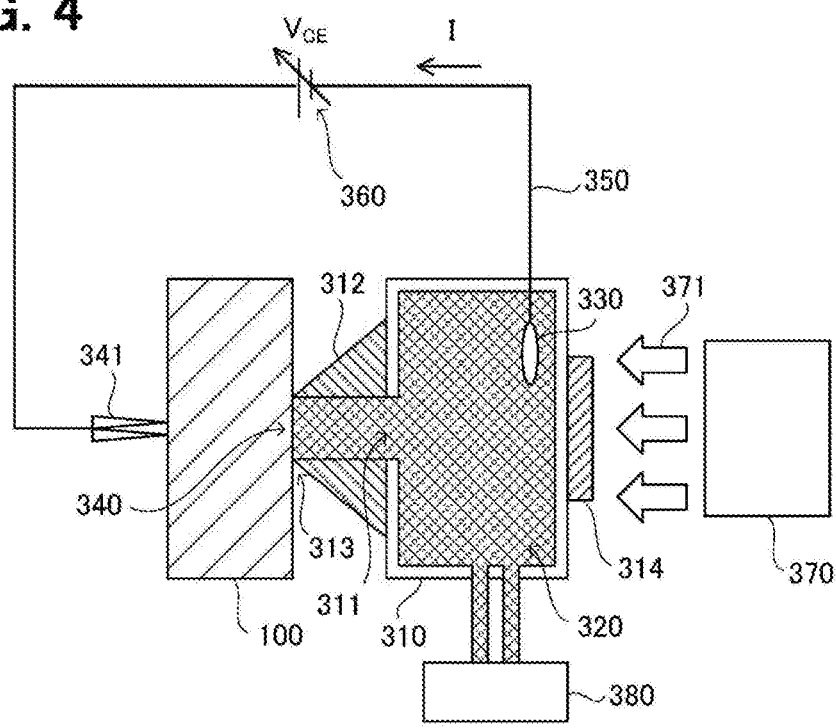
FIG. 4 is a schematic structural diagram illustrating an example of an electrochemical cell.

Now, anodic oxidation etching and the internal flatness of the recess formed using Anodic oxidation etching will be described along the experimental example. FIG. 4 is a schematic structural diagram illustrating an example of an electrochemical cell 300 used in anodic oxidation etching. A container 310 stores an electrolyte solution 320. As an example of the electrolyte solution 320, a 0.01 M sodium hydroxide (NaOH) solution to which 1% of Triton (registered trademark) X-100 (by Sigma Chemical) has been added as a surfactant may be used.

A platinum (Pt) coil may be used as an example of a cathode electrode 330. The cathode electrode 330 is disposed in the electrolyte solution 320. The GaN material 100 is used as an anode electrode 340. The container 310 has an opening 311, and a sealing ring 312 is disposed so as to surround the opening 311 and be interposed between the container 310 and the GaN material 100. The GaN material 100 is disposed so as to close an opening 313 of the sealing ring 312 located on the opposite side from the container 310. Accordingly, the GaN material 100 contacts the electrolyte solution 320 filling the hole of the sealing ring 312. An ohmic contact probe 341 is attached to the GaN material 100 (anode electrode 340) so as not to contact the electrolyte solution 320.

The cathode electrode 330 and the ohmic contact probe 341 attached to the anode electrode 340 are connected to each other by a wire 350. A voltage source 360 is inserted partway through the wire 350. The voltage source 360 applies a prescribed etching voltage between the cathode electrode 330 and the anode electrode 340 at a prescribed timing.

A light source 370 is disposed on the outside of the container 310. The light source 370 emits ultraviolet (UV) light 371 having a prescribed irradiation intensity at a prescribed timing. Usable examples of the light source 370 include mercury xenon (Hg—Xe) lamps (for example, LIGHTNINGCURE (registered trademark) L9566-03 (by Hamamatsu Photonics K.K.)). A window 314 allowing the UV light 371 to pass through is provided on the container 310. The UV light 371 emitted from the light source 370 passes through the window 314, the electrolyte solution 320, the opening 311 of the container 310, and the opening 313 of the sealing ring 312 and irradiates the GaN material 100 (anode electrode 340). A pump 380 is attached to the container 310. The pump 380 agitates the electrolyte solution 320 in the container 310 at a prescribed timing.

As the anode electrode 340 is irradiated with the UV light 371, the following reaction progresses in the anode electrode 340 and the cathode electrode 330. In the anode electrode 340, holes resulting from the UV light 371 irradiation resolve the GaN into $Ga^{3+}$ and $N_2$ (chem. 1), and moreover, $Ga^{3+}$ is oxidized by the $OH^-$ group (chem. 2), resulting in the generation of gallium oxide ($Ga_2O_3$). As a result of the generated $Ga_2O_3$ being dissolved by the NaOH solution (electrolyte solution 320), the anode electrode 340, i.e. the GaN material 100, is etched. Anodic oxidation etching is carried out in this way.

(Anode Reaction)

$$GaN(s) + 3h^+ \rightarrow Ga^{3+} + \tfrac{1}{2}N_2\uparrow \quad \text{[Chemical Formula 1]}$$

$$Ga^{3+} + 3OH^- \rightarrow \tfrac{1}{2}Ga_2O_3(s) + \tfrac{3}{2}H_2O(l) \quad \text{[Chemical Formula 2]}$$

$$H_2O(l) + 2h^+ \rightarrow \tfrac{1}{2}O_{2\uparrow} + 2H^+ \quad \text{[Chemical Formula 3]}$$

$$2H_2O(l) + 2e^- \rightarrow 2OH^- + H_2(g) \quad \text{(Cathode reaction) [Chemical Formula 4]}$$

In the experimental example, specifically, the epitaxial substrate 30 was used as the GaN material 100 constituting the anode electrode 340. For more detailed description, the epitaxial layer 20 was irradiated with the UV light 371 while the epitaxial layer 20 side of the epitaxial substrate 30 was contacting the electrolyte solution 320, thereby causing anodic oxidation at the epitaxial layer 20 to etch the same. In other words, the principal face 20s of the epitaxial layer 20 was used as an etched face.

In the experimental example, a GaN substrate having a Si concentration of 1 to $2\times10^{18}/cm^3$ was used as the substrate 10. The epitaxial layer 20 was formed by growing a GaN layer having a Si concentration of $2\times10^{18}/cm^3$ and a thickness of 2 μm and a GaN layer having a Si concentration of $9\times10^{15}/cm^3$ and a thickness of 13 μm on the substrate 10 by MOVPE. The overall size of the epitaxial substrate 30 was set to be a diameter of 2 inches (5.08 cm) and the size of the area to be etched by the electrolyte solution 320 coming into contact with the epitaxial layer 20, i.e. the size of the opening 313 of the hole of the sealing ring 312, was set to a diameter of 3.5 mm.

The irradiation intensity at the etched face was set to be 9 mW/cm². UV light irradiation and application of the etching voltage were repeated intermittently by repeating a set consisting of: carrying out UV light irradiation and application of the etching voltage simultaneously for 13 seconds; and then stopping the same for 9 seconds. In other words, pulsed anodic oxidation was carried out. The etching voltage was changed from 0 V to 1 V, 2 V, and 3 V to confirm changes resulting therefrom in the flatness of the bottom surface of the recess formed using anodic oxidation etching. Results of the experimental example will be described below with reference to FIGS. 5 through 13.

In commercially available devices designed to carry out anodic oxidation etching on various materials, it is common to set the etching voltage to a high voltage exceeding 3 V. A characteristic of this experimental example lies in that a low etching voltage range of 3 V or lower is adopted.

Figure 5:
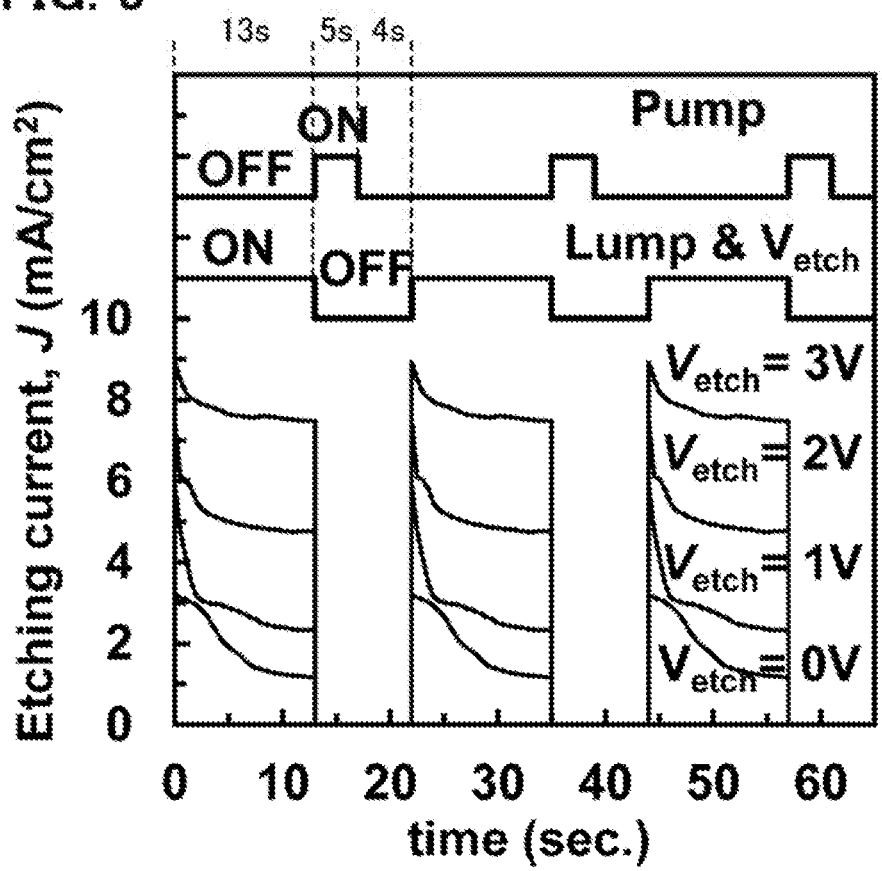
FIG. 5 is a timing chart illustrating a sequence of anodic oxidation etching.

FIG. 5 is a timing chart illustrating a sequence of anodic oxidation etching. As mentioned above, UV light irradiation and application of the etching voltage were repeated intermittently by repeating a set consisting of: carrying out UV light irradiation ("Lump" in the drawings) and application of the etching voltage ("Vetch" in the drawings) simultaneously for 13 seconds; and then stopping the same for 9 seconds. The pump 380 is used to agitate the electrolyte solution 320 ("Pump" in the drawings) within the period in which UV light irradiation and the application of the etching voltage are stopped, more specifically, in the first 5 seconds of this period.

The lower part of FIG. 5 illustrates the etching currents corresponding to cases where the etching voltages of 0 V, 1 V, 2 V, and 3 V were used. For all etching voltages, an etching current flows during the UV light irradiation period and does not flow during the UV light stoppage period. During the UV light irradiation period, an etching current flows as a result of the $OH^-$ group reaching the anode electrode 340 according to the aforementioned anode reaction, even if the etching voltage is 0 V. An increase in the etching voltage results in an increase in a drive force of attracting the $OH^-$ group toward the anode electrode 340, leading to an increase in the etching current.

Figure 6:
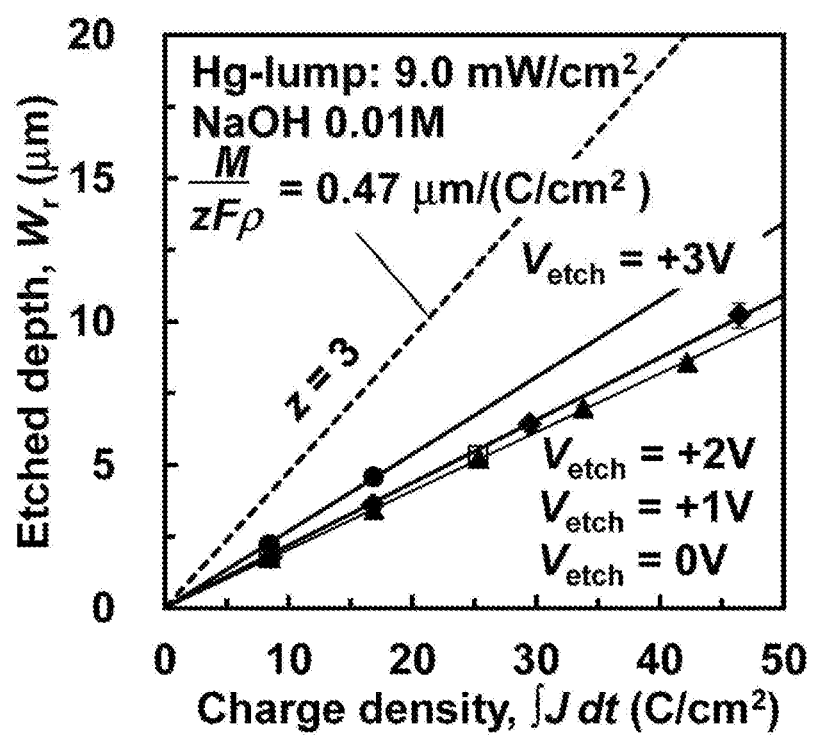
FIG. 6 is a graph illustrating a relationship between an amount of charge per unit area consumed by anodic oxidation and etched depth.

FIG. 6 is a graph illustrating a relationship between an amount of charge per unit area consumed by anodic oxidation and etched depth (etch depth, etching depth). The result corresponding to the 0 V-etching voltage is illustrated with a square plot, and likewise, 1 V-etching voltage: triangular plot, 2 V-etching voltage: rhombic plot, and 3 V-etching voltage: circular plot. The same plotting is used in FIG. 7 that will be described later.

Etched depth was measured using a step profiler (Sloan, Dektak3 ST). It can be seen that the etched depth changes linearly in relation to the consumed amount of charge. The etched depth $W_r$ is expressed as

[Formula 1]

$$W_r = M/zF\rho \int J\, dt \quad (1)$$

according to the Faraday's law. Here, "M" expresses the molecular weight of GaN, "z" expresses the required valence for anodic oxidation per 1 mol of GaN, "F" expresses a Faraday constant, "ρ" expresses the density of GaN, and "J" expresses etching current density. According to expression (1), the hole necessary for anodic oxidation of 1 mol of GaN is z=5.3-6.8 mol. For the generation of $Ga_2O_3$ (chem. 1 and chem. 2) alone, z=3 mol. Thus, this result indicates that in the anode electrode 340, oxygen gas is generated in addition to the generation of $Ga_2O_3$ and the hole is consumed.

Figure 7:
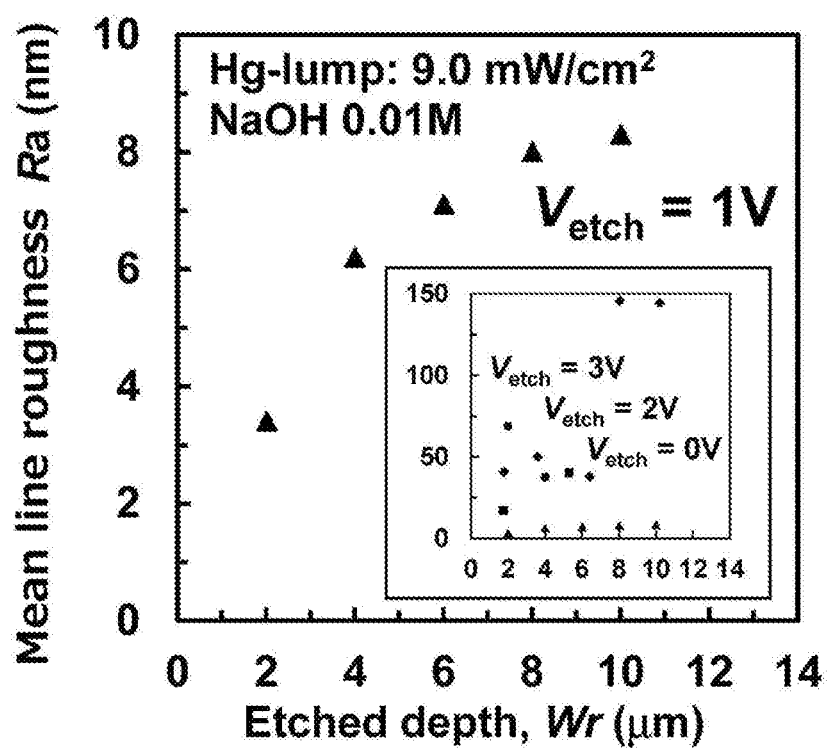
FIG. 7 is a graph illustrating a relationship between etched depth and profile roughness Ra of a bottom surface of a formed recess.

FIG. 7 is a graph illustrating a relationship between etched depth and calculated average profile roughness (arithmetic mean line roughness) Ra (may be referred to simply as "profile roughness Ra" in this specification) of a bottom surface of a formed recess in the first experimental example. The profile roughness Ra was measured with a contact-type step profiler (Sloan, Dektak3 ST). In the measurement with the contact-type step profiler, the profile roughness Ra was calculated by using, within the evaluation length of 500 μm, 100 μm as a reference length. In other words, the measurement length for obtaining the profile roughness Ra was set to be 100 μm. In FIG. 7, the results obtained with the etching voltage of 1 V are illustrated in enlarged fashion as representative results, and together therewith, the results for the etching voltages of 0 V, 2 V, and 3 V are illustrated in reduced fashion in the lower right part.

It can be seen that in the range in which the etched depths are between 0 μm and 10 μm (inclusive), the profile roughness Ra for the etching voltage of 1 V is remarkably small for all depths. For example, for the etched depth of 10 μm, while the profile roughness Ra for the etching voltage of 2 V is about 150 nm, the profile roughness Ra for the etching voltage of 1 V is as extremely small as 10 nm or less, specifically about 8 nm. In other words, it can be seen that the flatness of the bottom surface of the recess formed with the etching voltage of 1 V is remarkably superior. It should be noted that an increase in the depth of a recess tends to result in a decrease in the flatness of the bottom surface.

Figure 8:
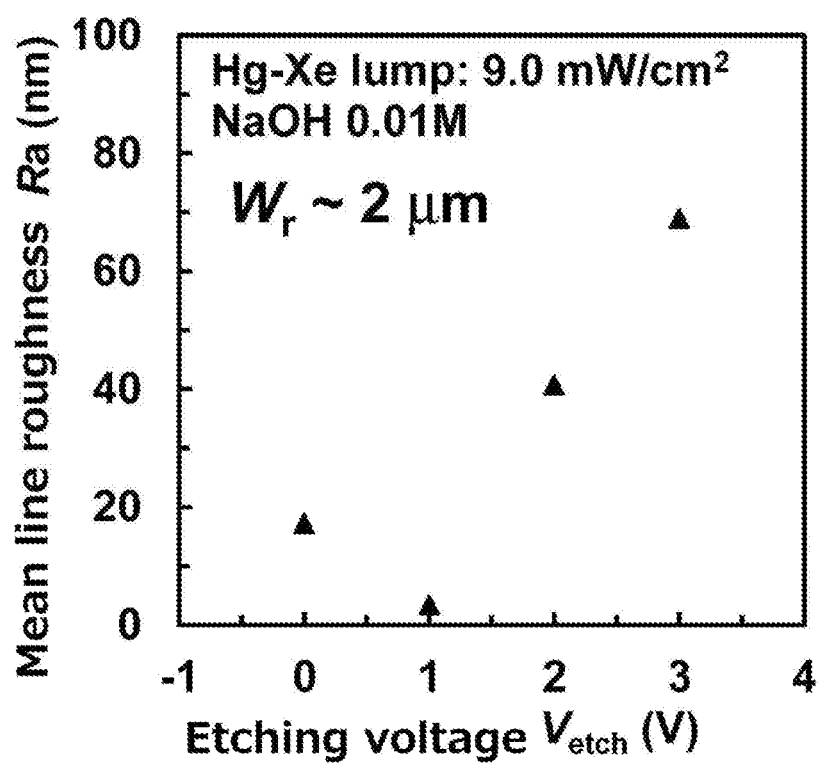
FIG. 8 is a graph illustrating a relationship between an etching voltage and profile roughness Ra in a case where the etched depth is 2 µm.
Figure 9:
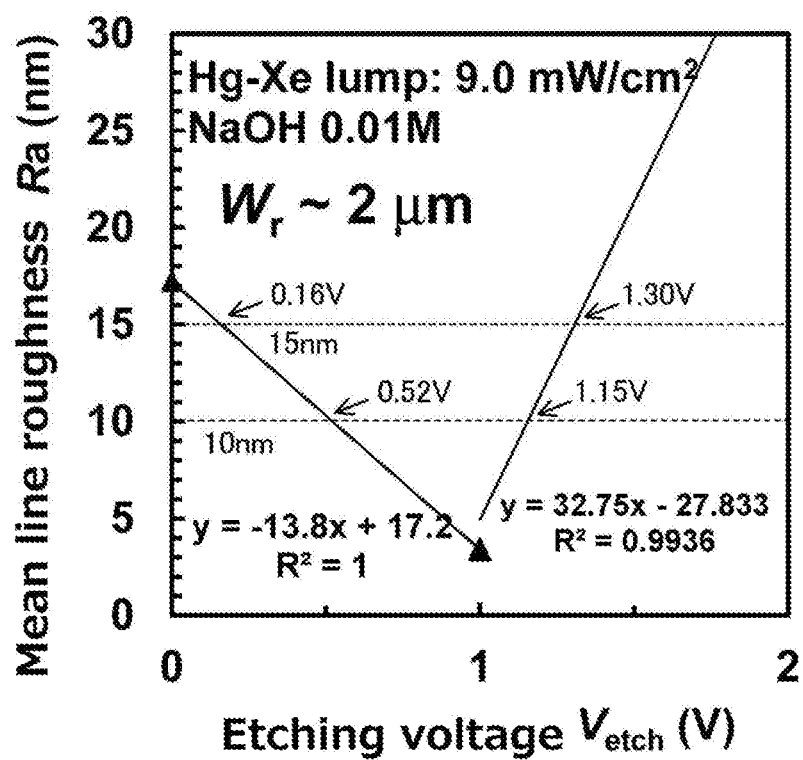
FIG. 9 is a graph in which etching voltage 1 V and the vicinity thereof in FIG. 8 are enlarged.

FIG. 8 is a graph illustrating a relationship between an etching voltage and profile roughness Ra in a case where the etched depth is 2 μm (a graph in which the results for the etched depth of 2 μm in FIG. 7 are plotted anew). FIG. 9 is a graph in which the etching voltage of 1 V and the vicinity thereof in FIG. 8 are enlarged.

The profile roughness Ra is 17 nm, 3.5 nm, 40 nm, and 70 nm for the etching voltages of 0 V, 1 V, 2 V, and 3 V, respectively. For the etching voltage of 1 V, a very flat bottom surface with a profile roughness Ra of no more than 5 nm is obtained. In view of this result, an etching voltage for which the profile roughness Ra will be no more than 15 nm, for example, can be estimated to be a voltage falling within the range of 0.16 V to 1.30 V (inclusive), whereas an etching voltage for which the profile roughness Ra will be no more than 10 nm, for example, can be estimated to be a voltage falling within the range of 0.52 V to 1.15 V (inclusive).

Figure 10A:
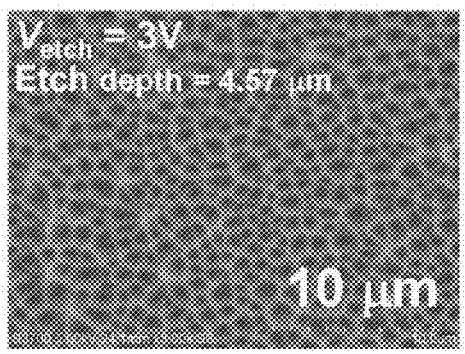
FIGS. 10A through 10C are SEM images of bottom surfaces of recesses in cases where etching voltages are set to 3 V, 2 V, and 1 V.
Figure 10B:
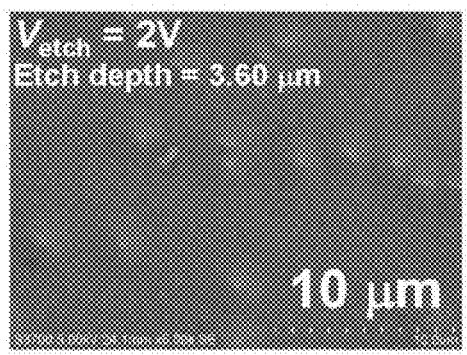
Figure 10C:
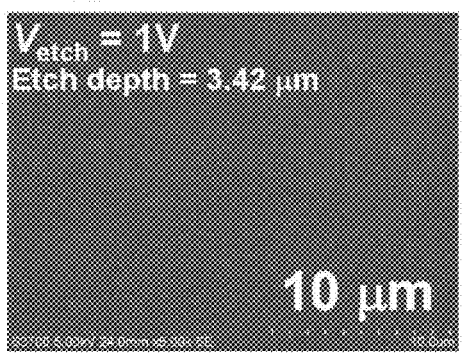
Figure 10D:
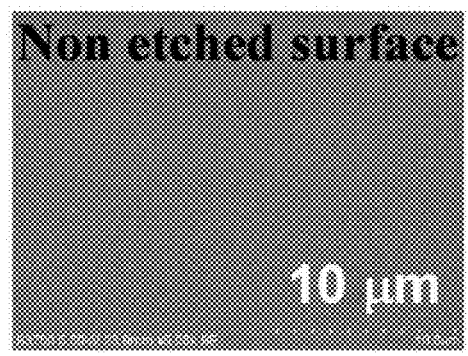
FIG. 10D is a SEM image of a surface in a case where no etching is carried out.
Figure 11A:
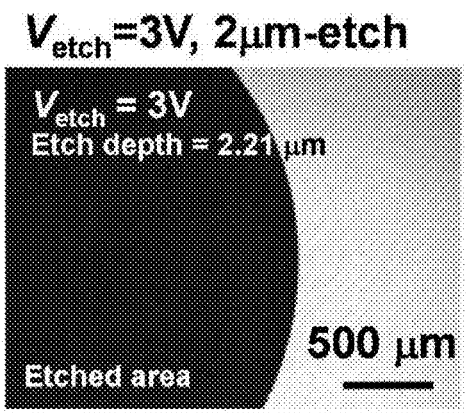
FIGS. 11A through 11D are optical microscopic images of bottom surfaces of recesses in cases where etching voltages are set to 3 V, 2 V, 1 V, and 0 V.
Figure 11B:
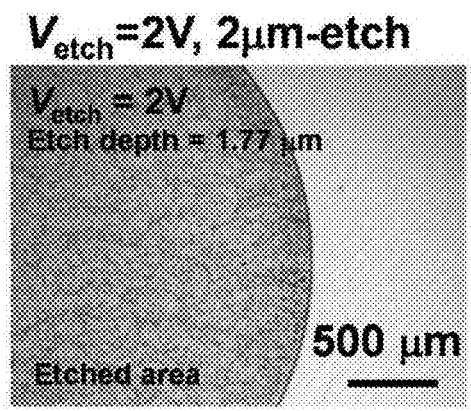
Figure 11C:
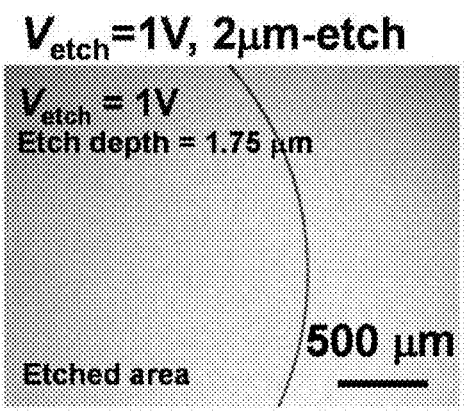
Figure 11D:
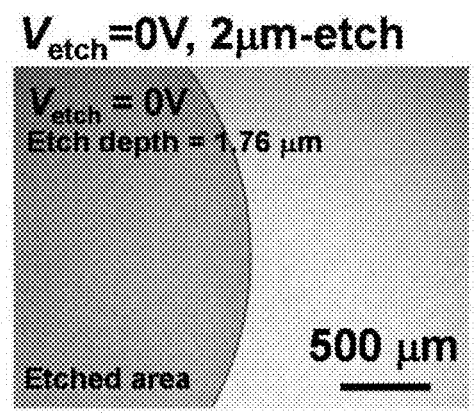
Figure 12A:
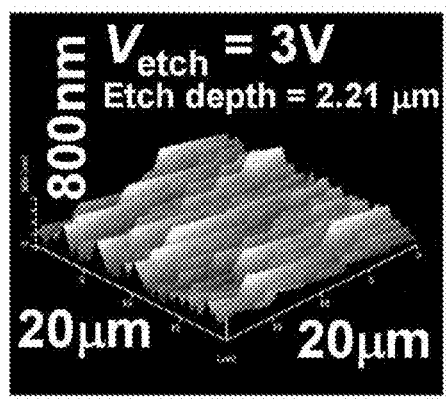
FIGS. 12A through 12D are AFM images of the bottom surfaces of the recesses formed in the cases where the etching voltages are set to 3 V, 2 V, 1 V, and 0 V.
Figure 12B:
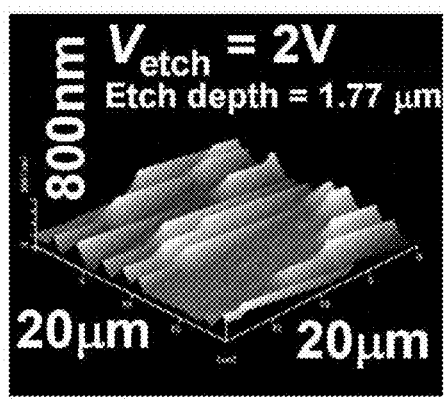
Figure 12C:
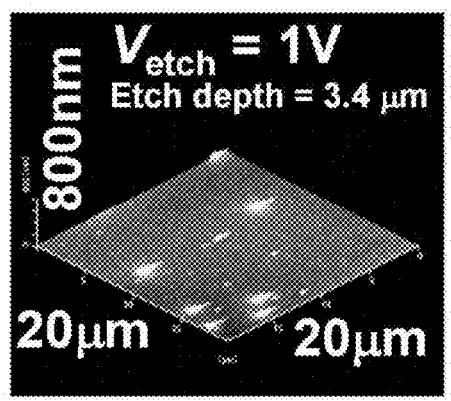
Figure 12D:
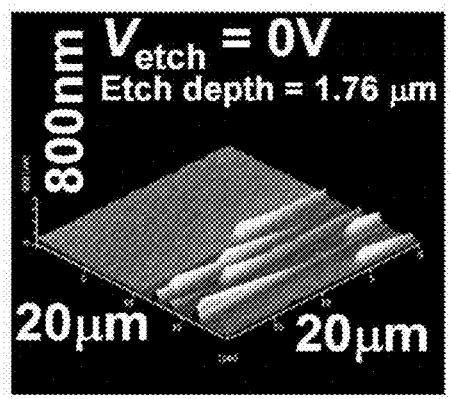

FIGS. 10A through 10C are scanning electron microscopic (SEM) images of bottom surfaces of recesses formed in cases where the etching voltages are set to 3 V, 2 V, and 1 V FIG. 10D is a SEM image obtained in a case where no etching is carried out. It can be seen thon the bottom surface of the recess has superior flatness for the etching voltage of 1 V.

FIGS. 11A through 11D are optical microscopic images of bottom surfaces of recesses formed in cases where the etching voltages are set to 3 V 2 V 1 V and 0 V. The circular area illustrated in the left part of each image illustrates the etched area, i.e. the recess. It can be seen that for the etching voltage of 1 V, the bottom surface of the recess has superior flatness over a wide area of, for example, 500 μm square or more or, for example, 1 mm square or more.

FIGS. 12A through 12D are atomic force microscopic (AFM) images of the bottom surfaces of the recesses formed in the cases where the etching voltages are set to 3 V, 2 V. 1 V, and 0 V. It can be seen than the bottom surface of the recess has superior flatness for the etching voltage of 1 V. For the etching voltage of 1 V, the calculated average surface roughness Ra for a 5 nm-square measurement area (area subject to evaluation) in the bottom surface of the recess, as measured using AFM, is 2.6 nm. Meanwhile, for the etching voltage of 0 V, nonuniformity is observed in terms of the presence of both areas with relatively superior flatness and areas with relatively inferior flatness. It is inferred that the reason for this nonuniformity is that since no etching voltage is applied, the ease with which the OH⁻group is supplied, i.e. the ease with which $Ga_2O_3$ is generated, differs from one area to another, resulting in the presence of areas that are etched more readily and areas that are etched less readily.

Figure 13:
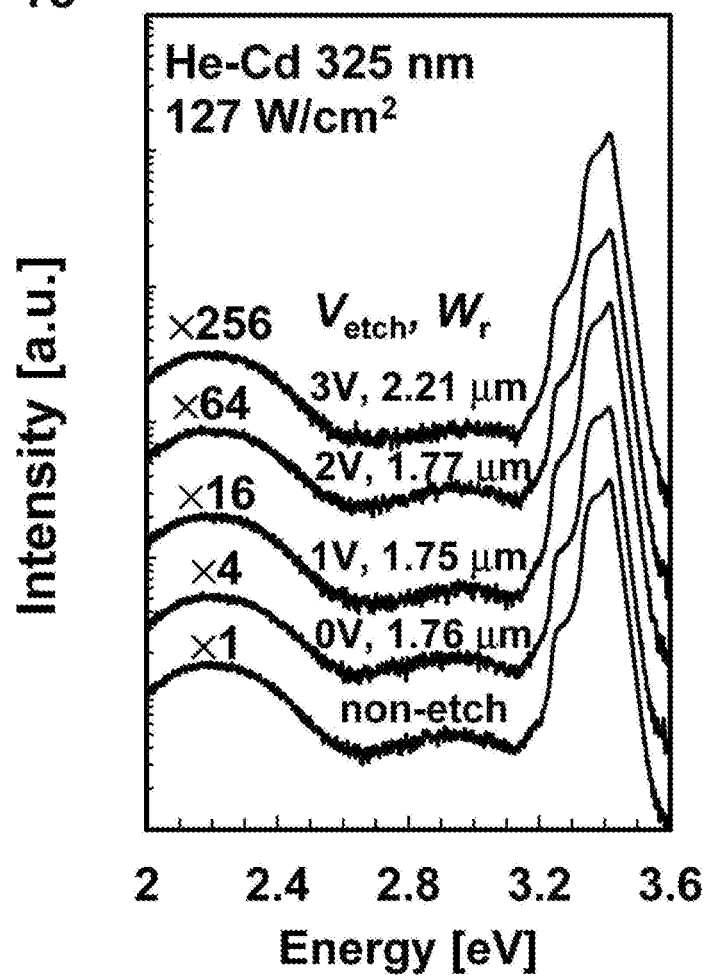
FIG. 13 illustrates PL emission spectra in the cases where no etching is carried out and where the etching voltages are set to 0 V, 1 V, 2 V, and 3 V.

FIG. 13 is a graph illustrating how the photoluminescence (PL) characteristics of a GaN material change according to anodic oxidation etching and illustrates PL emission spectra in the cases where no etching is carried out and where the etching voltages are set to 0 V, 1 V, 2 V, and 3 V. The peak intensity of a PL emission spectrum at a band edge of GaN (about 3.4 eV) will be referred to as "band-edge peak intensity" here. The band-edge peak intensities for all etching voltages have an intensity that is 90% or more in relation to the band-edge peak intensity for when no etching was carried out. In other words, when any of those etching voltages are used, the rate of change (reduction) in band-edge peak intensity due to anodic oxidation is less than 10%. Thus, as can be seen, the anodic oxidation etching has demonstrated itself as being a method with which GaN material can be processed with almost no damage to the GaN crystal.

Results obtained in the experimental example can be summarized as follows. When a recess is formed in the GaN material 100 using anodic oxidation etching while changing the etching voltage from 0 V to 1 V, 2 V, and 3 V, the flatness of the bottom surface of the recess is superior for the etching voltage of 1 V above all. It is inferred that if the etching voltage is excessively high, for example 2 V or 3 V, the etching is intense, and this leads to a decrease in the flatness of the bottom surface of the recess. Meanwhile, it is inferred that if the etching voltage is excessively low, 0 V then areas that are etched more readily and areas that are etched less readily occur, and this also leads to a decrease in the flatness of the bottom surface of the recess.

It is inferred that if the etching voltage is about 1 V the etching is appropriate, and this leads to an increase in the flatness of the bottom surface of the recess. To give a specific example, for the purpose of providing a rough standard for obtaining a profile roughness Ra of about 15 nm or less for the bottom surface of a recess to be formed, it is preferred that the etching voltage be a voltage falling within the range of 0.16 V to 1.30 V (inclusive). To give another example, for the purpose of providing a rough standard for obtaining a profile roughness Ra of about 10 nm or less for the bottom surface of a recess to be formed, it is preferred that the etching voltage be a voltage falling within the range of 0.52 V to 1.15 V (inclusive).

As described above, in the experimental example, anodic oxidation etching that results in superior flatness could be carried out with an etching voltage of about 1 V. An etching voltage of about 1 V is significantly lower than etching voltages that are usually used for anodic oxidation etching, e.g. an etching voltage exceeding 3 V It is considered that in order to make anodic oxidation etching with such a low etching voltage possible, it is preferred that, primarily, the dislocation density of the GaN material 100 in the etched face be adequately low (for example, less than $1\times10^7/cm^2$ at maximum); this is because in areas where the dislocation density is excessively high (for example, $1\times10^7/cm^2$ or more), the holes generated due to UV light irradiation are trapped, which inhibits anodic oxidation. In addition, in order to achieve etching resulting in superior flatness with such a low etching voltage, it is preferred that the in-plane uniformity of the GaN material 100 in the etched face be high so that nonuniformity in terms of the ease with which anodic oxidation occurs is limited.

In view of the above discussion, the profile roughness Ra of a bottom surface of a recess formed using anodic oxidation etching can be used as an index for evaluating the characteristics (lowness of dislocation density and in-plane uniformity) of the GaN material 100. The GaN material 100 according to the first and second embodiments. i.e. the substrate 10 and the epitaxial substrate 30, is characterized by being a GaN material in which a recess with superior internal flatness can be formed using anodic oxidation etching. Specifically, the GaN material 100 according to the first and second embodiments constitutes a GaN material having a low dislocation density and high in-plane uniformity to a degree such that, when assuming a case where a recess with the depth of 2 μm is to be formed using anodic oxidation etching (etching voltage=1 V) while carrying out UV light irradiation, then the bottom surface of the recess will be formed into a flat face having a profile roughness Ra of preferably 15 nm or less, more preferably 10 nm or less, yet more preferably 5 nm or less.

The surface of the GaN material 100 having undergone no etching ("non-etched surface" below) is flat to a degree such that the profile roughness Ra thereof is, for example, 0.5 nm.

In other words, in a member obtained by forming a recess in the GaN material 100 using anodic oxidation etching (also referred to as a "GaN member" below), the non-etched surface consisting of an upper face on the outside of the recess is flat to a degree such that the profile roughness Ra thereof is, for example, 0.5 nm. The profile roughness Ra being preferably 15 nm or less, more preferably 10 nm or less, yet more preferably 5 nm or less as described above implies that the profile roughness Ra of the bottom surface of the recess of the GaN member (GaN material 100) is preferably 30 times or less, more preferably 20 times or less, yet more preferably 10 times or less than the profile roughness Ra of the surface (non-etched surface) on the outside of the recess. Note thon the bottom surface of a recess, the etched depth of which is shallower than 2 µm, can be said to be more flat than the bottom surface of a recess having a 2-µm etched depth. Thus, the aforementioned condition is applicable to the formation of not only a recess having a 2 µm-etched depth but also to a recess having an etched depth of less than or equal to 2 µm.

For a bottom surface of a recess formed using anodic oxidation etching as described above, damage to the GaN crystal caused by the etching is little. Thus, for the GaN member (GaN material 100), the band-edge peak intensity of the PL emission spectrum for the bottom surface of a recess has an intensity that is 90% or more in relation to the band-edge peak intensity of the PL emission spectrum for the surface on the outside of the recess (non-etched surface).

For the evaluation method described hereabove, the formation of a structure is assumed in which the "recess" is one that has a bottom surface, i.e. the GaN material 100 is not penetrated through, but when actually carrying out processing using anodic oxidation etching, a structure may be formed where the GaN material 100 is penetrated through to form the "recess".

The etching voltage conditions revealed in the experimental example are considered to be valid as a rough standard for improving the internal flatness of a recess for not only the Anodic oxidation etching designed for the GaN material 100 according to the first and second embodiments, but also Anodic oxidation etching that is performed on an area of a GaN material having an adequately low dislocation density (for example, less than $1 \times 10^7 /cm^2$). That is to say, in cases where a recess is formed in an area of a GaN material having a dislocation density of, for example, less than $1 \times 10^7 /cm^2$ using Anodic oxidation etching through the application of etching voltage while carrying out UV light irradiation, the etching voltage is preferably within the range of 0.16 V to 1.30 V (inclusive), more preferably 0.52 V to 1.15 V (inclusive). Such a standard is especially useful when forming a deep recess that has a depth of, for example, 1 µm or more or, for example, 2 µm or more, where the flatness of the bottom surface of the recess is prone to degradation. Meanwhile, such a standard is also useful when forming a shallow recess (having a depth of, for example, less than 1 µm), and the use of such a standard enables the formation of a bottom surface of a recess having further superior flatness. This is because a decrease in etched depth results in an increase in the flatness of a bottom surface of a recess.

For the purpose of increasing flatness, it is preferred that such Anodic oxidation etching be carried out in the manner of an intermittent repetition of UV light irradiation and application of etching voltage. Moreover, to make it even more preferable, the electrolyte solution used for Anodic oxidation etching is agitated during the period in which UV light irradiation and application of etching voltage are stopped.

In the experimental example, flatness of the bottom surface of a recess formed using Anodic oxidation etching has been subject to evaluation; however, a bottom surface being formed flat means etching conditions are appropriate and also implies that side faces are formed flat as well. In other words, carrying out Anodic oxidation etching according to the conditions described above achieves an increase in the internal flatness of the recess formed.

In the experimental example, the irradiation intensity of UV light at the etched face is 9 mW/cm². The irradiation intensity of 20 mW/cm² for mask aligners, for example, is a value commonly and widely employed for UV light irradiation intensity. The first experimental example is carried out under a condition that facilitates implementation, where the irradiation intensity at the etched face is, for example, no more than 20 mW/cm².

In the experimental example, a NaOH solution having a concentration of 0.01 M is used as the electrolyte solution: however, the concentration of the electrolyte solution may be adjusted as appropriate. For example, if the concentration is made lower than 0.01 M (for example, about 0.003 M), the etching flatness can be further increased despite a decrease in the etching rate. Alternatively, the concentration may be made higher than 0.01 M to such an extent that appropriate etching flatness can be maintained (for example, 0.02 M or lower).

Third Embodiment

Figure 14A:
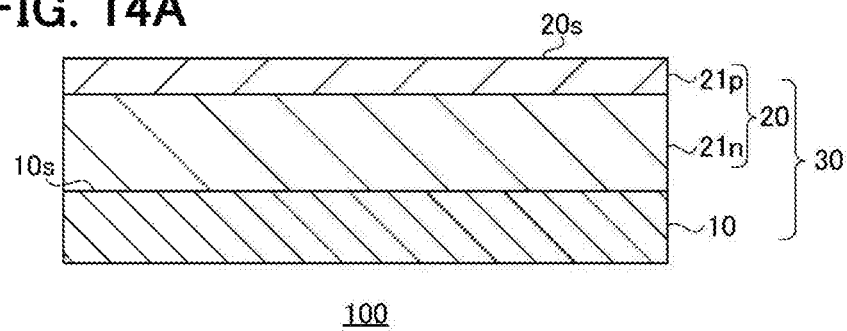
FIGS. 14A through 14C are schematic sectional diagrams illustrating part of a method for producing a semiconductor device employing a GaN material (epitaxial substrate) according to a third embodiment.

Next, a third embodiment will be described. The third embodiment features an epitaxial substrate 30 including a GaN substrate 10 and an epitaxial layer 20 as an example of a GaN material 100, as illustrated in FIG. 14A. The constitution of the epitaxial layer 20 according to the third embodiment differs from that of the epitaxial layer 20 according to the second embodiment in including a GaN layer 21*n* to which n-type impurities have been added (also referred to as an "epitaxial layer 21*n*" below) and a GaN layer 21*p* to which p-type impurities have been added (also referred to as an "epitaxial layer 21*p*" below). For the substrate 10, the substrate 10 described in the first embodiment may be used preferably.

Although there are no particular limitations on the constitution of the substrate 10 and the epitaxial layer 20 (epitaxial layers 21*n* and 21*p*), the following illustrates a possible example. For the substrate 10 and the epitaxial layer 21*n*, a constitution equivalent to that of the substrate 10 and the epitaxial layer 20 described in the second embodiment may be adopted as an example. For the p-type impurities, magnesium (Mg) may be used as an example. The epitaxial layer 21*p* may be constituted by, for example, a stack including: a GaN layer, which has a thickness of between 300 nm and 600 nm (inclusive), and to which Mg has been added at a concentration of between $2 \times 10^{17}/cm^3$ and $2 \times 10^{18}/cm^3$ (inclusive); and a GaN layer, which has a thickness of between 10 nm and 50 nm (inclusive), and to which Mg has been added at a concentration of between $1 \times 10^{20}/cm^3$ and $3 \times 10^{20}/cm^3$ (inclusive).

The epitaxial layer 20 (epitaxial layers 21*n* and 21*p*) may be grown on the principal face 10*s* of the substrate 10 by MOVPE, for example. Growth of the epitaxial layer 21*n* is equivalent to the growth of the epitaxial layer 20 described in the second embodiment. The epitaxial layer 21*p* is grown using TMG as an example of Ga raw material, $NH_3$ as an example of N raw material, and Bis-cyclopentadienyl magnesium ($CP_2Mg$) as an example of Mg raw material. The epitaxial layers 21*n* and 21*p* grow incorporating the crystallinity of the substrate 10, so similarly to the substrate 10, have the maximum dislocation density thereof limited to be lower than $1\times10^7/cm^2$ while also having high in-plane uniformity. The epitaxial substrate 30 constituting the GaN material 100 according to the third embodiment is a suitable material to be processed using Anodic oxidation etching to form a recess with superior internal flatness, similarly to the GaN material 100 according to the first and second embodiments.

Figure 14B:
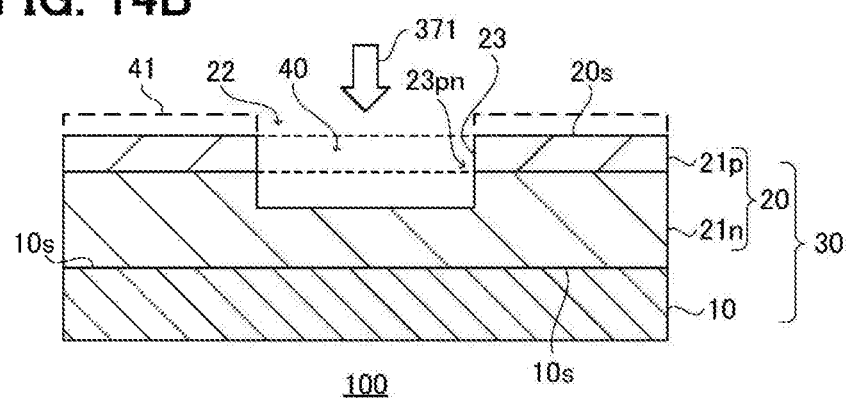

FIG. 14B illustrates Anodic oxidation etching designed for the epitaxial substrate 30. A principal face 20s of the epitaxial layer 20 is used as an etched face. The epitaxial substrate 30 is disposed in the electrochemical cell 300 in such a way that an area 22 to be etched in the principal face 20s contacts the electrolyte solution 320. Then, Anodic oxidation etching is carried out by applying etching voltage onto the area 22 while irradiating the same with UV light 371. In this example, a recess 40 is formed by penetrating through the epitaxial layer 21p and penetrating partway through the thickness of the epitaxial layer 21n. A pn junction 23pn constituted by the epitaxial layer 21p and the epitaxial layer 21n is exposed on a side face 23 of the recess 40. By setting the etching voltage to about 1 V as described above, a pn junction 23pn can be formed on a side face 23 having superior flatness. An area in the principal face 20s, which is located on the outside of the area 22 and is not subject to etching, may be covered with a mask 41 constituted by a hardmask or the like so as to be prevented from being etched. For the purpose of limiting unwanted etching (side etching) on the side face of the recess 40, the mask 41 may be constituted by a light-blocking mask and the linearity of the UV light 371 may be enhanced.

In cases where the epitaxial layer 20 includes an epitaxial layer 21p to which p-type impurities have been added as in the third embodiment, it is preferred that activation annealing for activating the p-type impurities in the epitaxial layer 21p be carried out after Anodic oxidation etching for the following reason. When the epitaxial layer 21p is a p-type conductive layer, the epitaxial layer 21p itself has a hole, so Anodic oxidation etching progresses more readily even without the LTV light 371. As a result, a difference occurs between the epitaxial layer 21n and the epitaxial layer 21p in terms of the ease with which etching progresses. Furthermore, since side etching occurs more readily in the epitaxial layer 21p, the flatness of the side face 23 of the recess 40 is prone to degradation. For this reason, it is preferred that Anodic oxidation etching be carried out before the epitaxial layer 21p is made into a p-type conductive layer, i.e. before subjecting the epitaxial layer 21p to activation annealing, from the viewpoint of improving flatness. In other words, it is preferred that activation annealing be carried out after Anodic oxidation etching and that the epitaxial layer 21p when subjected to Anodic oxidation etching has not undergone activation annealing.

Figure 14C:
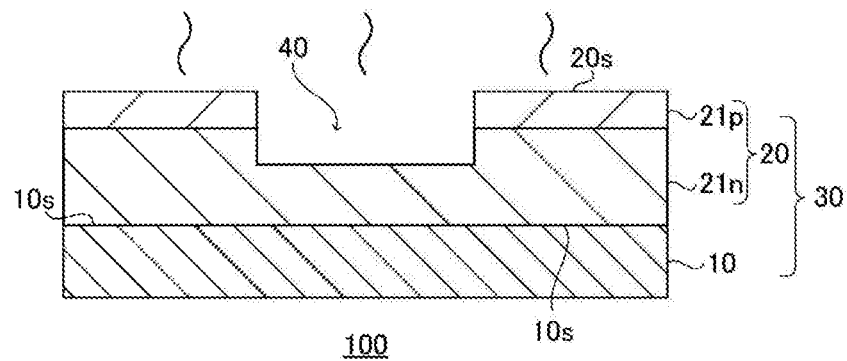

FIG. 14C illustrates activation annealing. Activation annealing is carried out to activate the n-type impurities in the epitaxial layer 21n, thereby making the epitaxial layer 21n into an n-type conductive layer, and to activate the p-type impurities in the epitaxial layer 21p, thereby making the epitaxial layer 21p into a p-type conductive layer. A technique known in the art may be used, as appropriate, to carry out the activation annealing.

Other Embodiments

Embodiments of the present invention have been described above by way of specific examples. However, the present invention is not limited to the above embodiments, and can undergo, for example, changes, improvements, or combinations in various ways within the scope of the invention.

The aforementioned anodic oxidation etching can be used preferably as part of a method for producing a semiconductor device in which a GaN material is used. For example, this anodic oxidation etching can be used for a structure formation method when producing a Schottky barrier diode using the GaN material 100 according to the second embodiment (an epitaxial substrate 30 in which an epitaxial layer 20 is constituted by a GaN layer to which n-type impurities have been added).

Furthermore, for example, the aforementioned anodic oxidation etching can be used as a structure formation method when producing a pn junction diode or a transistor using the GaN material 100 according to the third embodiment (an epitaxial substrate 30 in which an epitaxial layer 20 includes a GaN layer to which n-type impurities have been added and a GaN layer to which p-type impurities have been added).

It is also possible to carry out processing in which this anodic oxidation etching is used to remove only a p-type GaN layer constituting the surface layer of an n-p layered structure, as exemplified by the case of producing a junction barrier Schottky (JBS) diode.

The constitution of the epitaxial layer 20 can be selected, as appropriate, according to need and, for example, may include a GaN layer to which no electroconductive impurities are added or may be constituted by a layered structure of, for example, n-p-n. This anodic oxidation etching may be carried out exclusively on a specific layer of an epitaxial layer 20 having a layered structure. The GaN substrate is not limited to the substrate 10 described in the first embodiment and a GaN substrate having an area having an adequately low dislocation density (for example, lower than $1\times10^7/cm^2$) is used preferably. The electroconductivity of the substrate 10 may be selected, as appropriate.

To give an example, a metal-insulator-semiconductor field effect transistor (MISFET) of a trench gate structure may be produced in the following way. A layered structure of n-p-n (or p-n-p) is adopted for the epitaxial layer 20; a recess 40 is formed in the epitaxial layer 20 using aodic oxidation etching; and a npn junction (or pnp junction) serving as the operation part for the transistor is formed on the side face 23 of the recess 40. An insulated gate electrode is formed in the recess 40, in addition to which a source electrode and a drain electrode to be electrically connected to the n layers of the npn layered structure (or the p layers of the pnp layered structure) are formed. With this production method, the anodic oxidation etching can be used to form a MIS interface, at which the npn junction (or pnp junction) serving as the operation part for a semiconductor device is located, while incurring little damage and the resultant interface having superior flatness; thus, a semiconductor device having high operation performance can be produced simply.

The electrode structure when producing a semiconductor device using the GaN material 100 may differ according to the electroconductive characteristics of the substrate 10. For example, the structure of an electrode to be electrically connected to an n-type GaN layer formed on the front surface of the substrate 10 may be as follows. For example, when producing a light-emitting diode (LED) using an n-type conductive substrate 10, the electrode may be formed on the rear surface of the substrate 10. Meanwhile, when, for example, producing a GaN-high electron mobility transistor (HEMT) using a semi-insulating substrate 10, the electrode will be formed on the n-type GaN layer, i.e. on the front surface side of the substrate 10.

<Preferable Aspects of the Present Invention>

Preferable aspects of the present invention will be supplementarily described hereafter.

(Supplementary Description 1)

There is provided a GaN material having arithmetic mean line roughness Ra of 15 nm or less, preferably 10 nm or less, and further preferably 5 nm or less (to such extent, dislocation density is low and in-plane uniformity is high) at a measurement length of 100 μm on a bottom surface of a recess when anodic oxidation etching is performed at an etching voltage of 1 V while irradiating the GaN material with UV light to form the recess of 2 μm (or 2 μm or less) in depth.

(Supplementary Description 2)

There is provided the GaN material according to supplementary description 1, wherein a maximum in-plane dislocation density is less than $1 \times 10^7/cm^2$ which is the plane where the recess of the GaN material is formed.

(Supplementary Description 3)

There is provided the GaN material according to supplementary description 1 or 2, wherein in the anodic oxidation etching, irradiation intensity of the LTV light is 20 mW/cm$^2$ or less (or 9 mW/cm$^2$), the UV light being directed to the surface where the recess is formed.

(Supplementary Description 4)

There is provided the GaN material according to any one of the supplementary descriptions 1 to 3, wherein the GaN material is a GaN substrate.

(Supplementary Description 5)

There is provided the GaN material according to any one of the supplementary descriptions 1 to 3, wherein the GaN material has a GaN substrate and a GaN layer epitaxially grown on the GaN substrate.

(Supplementary Description 6)

There is provided the GaN material according to supplementary description 5, wherein the epitaxially grown GaN layer has a GaN layer doped with n-type impurities at a lower concentration than those of the GaN substrate.

(Supplementary Description 7)

There is provided the GaN material according to supplementary description 5, wherein the epitaxially grown GaN layer has a GaN layer doped with p-type impurities and not annealed to activate the p-type impurities.

(Supplementary Description 8)

There is provided the GaN material according to supplementary description 5, wherein the epitaxially grown GaN layer includes a lamination structure of a first GaN layer doped with n-type impurities and a second GaN layer doped with p-type impurities.

(Supplementary Description 9)

There is provided a method of manufacturing a semiconductor device, including:

performing anodic oxidation etching to a region where a dislocation density of GaN material is less than $1 \times 10^7/cm^2$ by applying an etching voltage while irradiating this region with UV light, to form a recess, wherein the etching voltage is the voltage preferably in a range of 0.16 V or more and 1.30 V or less, more preferably in a range of 0.52 V or more and 1.15 V or less.

(Supplementary Description 10)

There is provided the method of manufacturing a semiconductor device according to supplementary description 9, wherein a depth of the recess is, for example, 1 μm or more, and for example, 2 μm or more.

(Supplementary Description 11)

There is provided the method of manufacturing a semiconductor device according to supplementary description 9 or 10, wherein in the anodic oxidation etching, irradiation intensity of the UV light is 20 mW/cm$^2$ or less, the UV light being directed to the surface where the recess is formed.

(Supplementary Description 12)

There is provided the method of manufacturing a semiconductor device according to any one of the supplementary descriptions 9 to 11, wherein in forming the recess, the irradiation of the UV light and the application of the etching voltage are intermittently repeated.

(Supplementary Description 13)

There is provided the method of manufacturing a semiconductor device according to supplementary description 12, wherein in forming the recess, an electrolyte used for the anodic oxidation etching is stirred while the irradiation of the UV light and the application of the etching voltage are stopped.

(Supplementary Description 14)

There is provided a method of manufacturing a semiconductor device, including:

preparing a GaN material having a GaN substrate and a GaN layer epitaxially grown on the GaN substrate, the epitaxially grown GaN layer further including a GaN layer doped with p-type impurities and not annealed to activate the p-type impurities; and performing anodic oxidation etching to the GaN layer while irradiating the GaN material with UV light, thereby performing etching to the GaN layer doped with p-type impurities and not annealed to activate the p-type impurities, to form a recess.

(Supplementary Description 15)

There is provided the method of manufacturing a semiconductor device according to supplementary description 14, wherein the epitaxially grown GaN layer further has a GaN layer doped with n-type impurities, and by etching the GaN layer doped with n-type impurities in the anodic oxidation etching, the recess is formed so as to expose a side surface of an epitaxially grown pn junction.

(Supplementary Description 16)

There is provided the method of manufacturing a semiconductor device according to supplementary description 14 or 15, including a step of performing annealing which activates the p-type impurities, after the anodic oxidation etching.

(Supplementary Description 17)

There is provided a GaN material, wherein when anodic oxidation etching is performed at an etching voltage of 1 V while irradiating the GaN material with UV light to form a recess of 2 μm in depth (or less than 2 μm), line roughness Ra at a measurement length of 100 μm on a bottom surface of the recess is preferably 30 times or less, more preferably 20 times or less, still more preferably 10 times or less of the line roughness Ra at a measurement length of 100 μm (to such an extent, dislocation density is low and in-plane uniformity is high) on the surface of the GaN material that has not been subjected to anodic oxidation etching.

(Supplementary Description 18)

There is provided the GaN material according to supplementary description 17, wherein band edge peak intensity of a PL emission spectrum on the bottom surface of the recess has an intensity of 90% or more with respect to band edge peak intensity of a PL emission spectrum on the surface of the GaN material not subjected to the anodic oxidation etching.

(Supplementary Description 19)

There is provided a GaN member, which is the GaN member having a recess, wherein line roughness Ra at a measurement length of 100 μm on the bottom surface of the recess is preferably 30 times or less, more preferably 20 times or less, still more preferably 10 times or less of the line roughness Ra at a measurement length of 100 μm on an outer surface of the recess.

(Supplementary Description 20)

There is provided the GuN member according to supplementary description 19, wherein band edge peak intensity of a PL emission spectrum on the bottom surface of the recess is 90% or more of the band edge peak intensity of the PL emission spectrum on the outer surface of the recess.

(Supplementary Description 21)

There is provided a semiconductor device having (manufactured using) the GaN material according to any one of the supplementary descriptions 1 to 8, the GaN material according to supplementary description 17 or 18, or the GaN member according to supplementary description 19 or 20.

DESCRIPTION OF REFERENCE SYMBOLS

1: underlying substrate
2: underlying layer
2a: void-including layer
3: metal layer
3a: nanomask
4: void-formed layer
5: void
6: crystal
10: GaN substrate
20: GaN layer (epitaxial layer)
21n: GaN layer to which n-type impurities have been added
21p: GaN layer to which p-type impurities have been added
22: area subject to etching
23: side face
23pn: pn junction
30: epitaxial substrate
40: recess
41: mask
100: GaN material
6s, 10s, 20s: principal face
200: HVPE device
300: electrochemical cell
310: container
320: electrolyte solution
330: cathode electrode
340: anode electrode
350: wire
360: voltage source
370: light source
371: UV light
380: pump

The invention claimed is:

1. A GaN material having arithmetic mean line roughness Ra of 15 nm or less at a measurement length of 100 μm on a bottom surface of a recess when anodic oxidation etching is performed at an etching voltage of 1 V while irradiating the GaN material with UV light to form the recess of 2 μm in depth.

2. The GaN material according to claim 1, wherein a maximum in-plane dislocation density is less than $1 \times 10^7/cm^2$, which is the plane where the recess of the GaN material is formed.

3. The GaN material according to claim 1, wherein the GaN material is a GaN substrate.

4. The GaN material according to claim 1, wherein the GaN material has a GaN substrate and a GaN layer epitaxially grown on the GaN substrate.

5. The GaN material according to claim 4, wherein the epitaxially grown GaN layer has a GaN layer doped with n-type impurities at a lower concentration than those of the GaN substrate.

6. The GaN material according to claim 4, wherein the epitaxially grown GaN layer has a GaN layer doped with p-type impurities and not annealed to activate the p-type impurities.

7. The GaN material according to claim 4, wherein the epitaxially grown GaN layer includes a lamination structure of a first GaN layer doped with n-type impurities and a second GaN layer doped with p-type impurities.

8. A method of manufacturing a semiconductor device, comprising:
  performing anodic oxidation etching to a region where a dislocation density of GaN material is less than $1 \times 10^7/cm^2$ by applying an etching voltage while irradiating this region with UV light, to form a recess,
  wherein the etching voltage is the voltage preferably in a range of 0.16 V or more and 1.30 V or less, more preferably in a range of 0.52 V or more and 1.15 V or less.

9. The method of manufacturing a semiconductor device according to claim 8, wherein in forming the recess, the irradiation of the UV light and the application of the etching voltage are intermittently repeated.

10. The method of manufacturing a semiconductor device according to claim 9, wherein in forming the recess, an electrolyte used for the anodic oxidation etching is stirred while the irradiation of the UV light and the application of the etching voltage are stopped.

11. A method of manufacturing a semiconductor device, comprising:
  preparing a GaN material having a GaN substrate and a GaN layer epitaxially grown on the GaN substrate, the epitaxially grown GaN layer further including a GaN layer doped with p-type impurities and not annealed to activate the p-type impurities; and
  performing anodic oxidation etching to the GaN layer while irradiating the GaN material with UV light, thereby performing etching to the GaN layer doped with p-type impurities and not annealed to activate the p-type impurities, to form a recess.

12. The method of manufacturing a semiconductor device according to claim 11, wherein the epitaxially grown GaN layer further has a GaN layer doped with n-type impurities, and by etching the GaN layer doped with n-type impurities in the anodic oxidation etching, the recess is formed so as to expose a side surface of an epitaxially grown pn junction.

13. The method of manufacturing a semiconductor device according to claim 11, comprising a step of annealing to activate the p-type impurities after the anodic oxidation etching.

* * * * *

UNITED STATES PATENT AND TRADEMARK OFFICE
CERTIFICATE OF CORRECTION

PATENT NO. : 10,665,683 B2
APPLICATION NO. : 16/284323
DATED : May 26, 2020
INVENTOR(S) : Fumimasa Horikiri Page 1 of 1

It is certified that error appears in the above-identified patent and that said Letters Patent is hereby corrected as shown below:

In the Specification

Column 7, Line 26, "HYPE" should read --HVPE--

Column 10, Line 28, "WrM/zFρ∫ I dt" should read -- $W_r = M/_{zF\rho} \int Jdt$ --

Column 11, Line 40, "5 nm-square" should read --5 μm-square--

Column 15, Line 41, "the LTV light" should read --the UV light--

Column 17, Line 25, "the LTV light" should read --the UV light--

Signed and Sealed this
Twenty-second Day of September, 2020

Andrei Iancu
*Director of the United States Patent and Trademark Office*